(12) United States Patent
Chen

(10) Patent No.: US 8,246,125 B2
(45) Date of Patent: Aug. 21, 2012

(54) ENCLOSURE OF ELECTRONIC DEVICE

(75) Inventor: Yun-Lung Chen, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 59 days.

(21) Appl. No.: 12/879,360

(22) Filed: Sep. 10, 2010

(65) Prior Publication Data

US 2011/0272306 A1   Nov. 10, 2011

(30) Foreign Application Priority Data

May 4, 2010  (CN) ...................... 2010 2 0178537 U

(51) Int. Cl.
*A47B 81/00* (2006.01)
*A47B 47/00* (2006.01)
*A47G 29/00* (2006.01)
*H05K 7/00* (2006.01)

(52) U.S. Cl. .................. 312/223.2; 312/263; 312/265.5; 361/679.02

(58) Field of Classification Search ............... 312/223.2, 312/265.5, 265.6, 257.1, 263; 361/724, 725, 361/816, 818
See application file for complete search history.

(56) References Cited

U.S. PATENT DOCUMENTS

| | | | | |
|---|---|---|---|---|
| 6,111,746 | A * | 8/2000 | Wahl et al. ..................... | 361/818 |
| 6,201,711 | B1 * | 3/2001 | Cherniski et al. ............. | 361/800 |
| 6,257,682 | B1 * | 7/2001 | Liu et al. ..................... | 312/223.2 |
| 6,309,037 | B2 * | 10/2001 | Bertolami ................... | 312/223.2 |
| 6,367,897 | B1 * | 4/2002 | Bass et al. .................. | 312/223.2 |
| 6,414,851 | B2 * | 7/2002 | Cherniski et al. ............. | 361/800 |
| 6,826,039 | B2 * | 11/2004 | Chen .......................... | 361/679.3 |
| 6,837,554 | B2 * | 1/2005 | Yamamoto et al. ......... | 312/223.2 |
| 7,597,412 | B2 * | 10/2009 | Chen et al. ................. | 312/223.2 |

* cited by examiner

*Primary Examiner* — David Dunn
*Assistant Examiner* — Ryan A Doyle
(74) *Attorney, Agent, or Firm* — Altis Law Group, Inc.

(57) ABSTRACT

An enclosure of an electronic device includes a rear plate and a cover. A support piece is located on a top edge of the rear plate. A first and second cutouts are defined at a conjunction portion of the rear plate and the support piece. Each of the first and second cutouts includes a first portion defined in the rear plate and a second portion defined in the support piece. A first elastic piece connects to the rear plate and extends into the second portion of the first cutout. A second elastic piece connects to the support piece and extends into the first portion of the second cutout. A distorted piece is located on a rear edge of the cover. The cover is placed on the support piece to abut the first elastic piece in a first direction, which is perpendicular to the cover. The distorted piece abuts the rear plate to urge the second elastic piece in a second direction, which is parallel with the cover.

12 Claims, 5 Drawing Sheets

ENCLOSURE OF ELECTRONIC DEVICE

BACKGROUND

1. Technical Field

The present disclosure relates to enclosures of electronic devices, more particularly to an enclosure of an electronic device capable of shielding EMI (Electro-Magnetic Interference).

2. Description of Related Art

In an enclosure of a typical electronic device, there are generally different kinds of electronic components such as Central Processing Units (CPUs) and accelerated chips mounted to a circuit board of the enclosure. The electronic components may emit electromagnetic radiation when operating. The EMI may have a great influence on other components mounted in the enclosure and even may lead to an abnormal function of the components.

Therefore, there is room for improvement within the art to provide an enclosure of an electronic device which can reduce EMI from a circuit board thereof.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
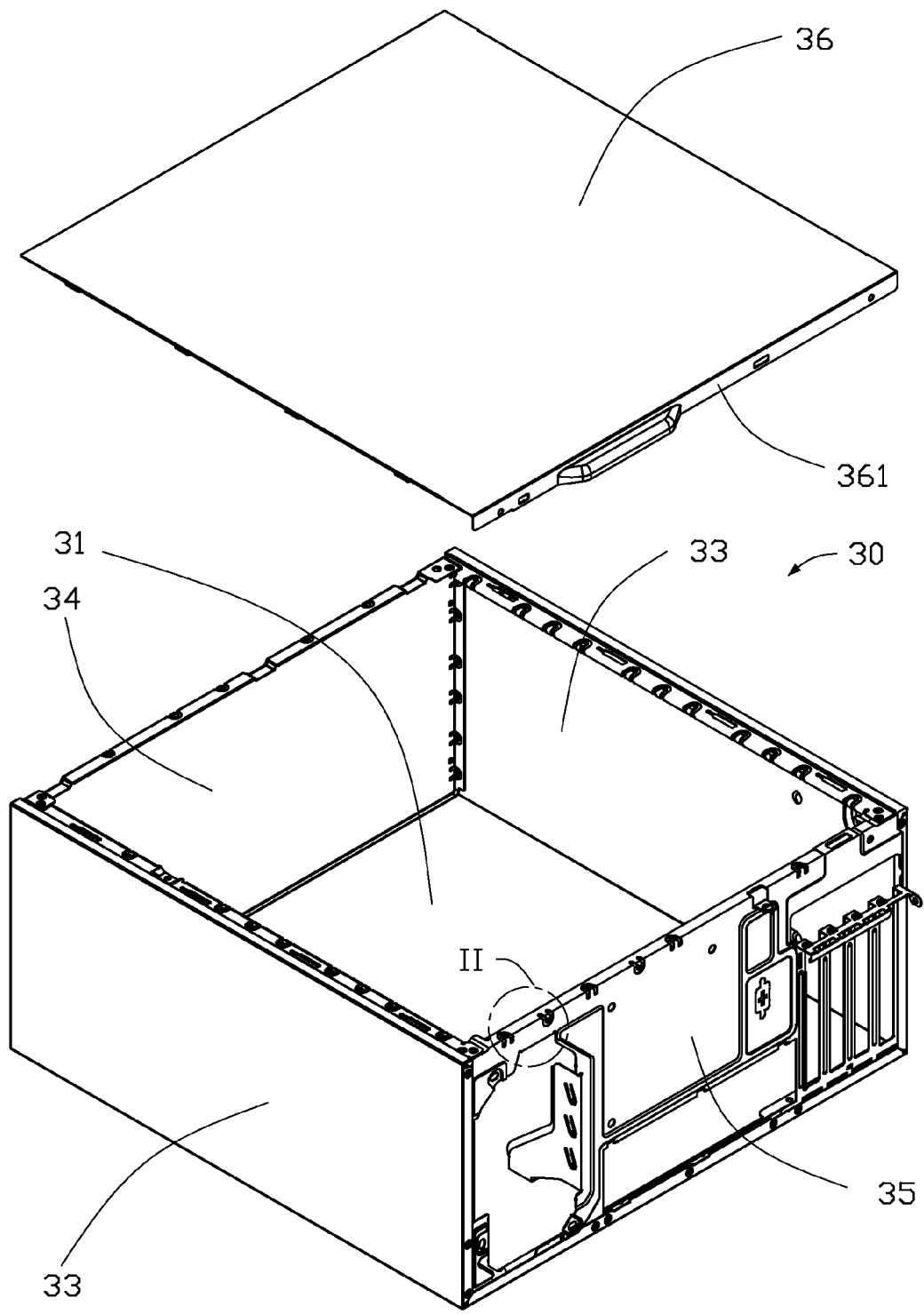
FIG. 1 is an isometric and exploded view of an enclosure of an electronic device in accordance with an embodiment.

Referring to FIG. 1, an enclosure 30 of an electronic device in accordance with an embodiment includes a bottom plate 31, a front plate 34, a rear plate 35, two substantially parallel side plates 33, and a cover 36. The front plate 34, the rear plate 35, and the two side plates 33 are perpendicularly connected to four edges of the bottom plate 31. The two side plates 33 are connected between the front plate 34 and the rear plate 35. Top edges of the front plate 34, the rear plate 35, and the two side plates 33 cooperate to define an opening. The cover 36 is configured to cover the opening. A rear edge of the cover 36 extends downward and substantially perpendicularly to form a distorted piece 361.

Figure 2:
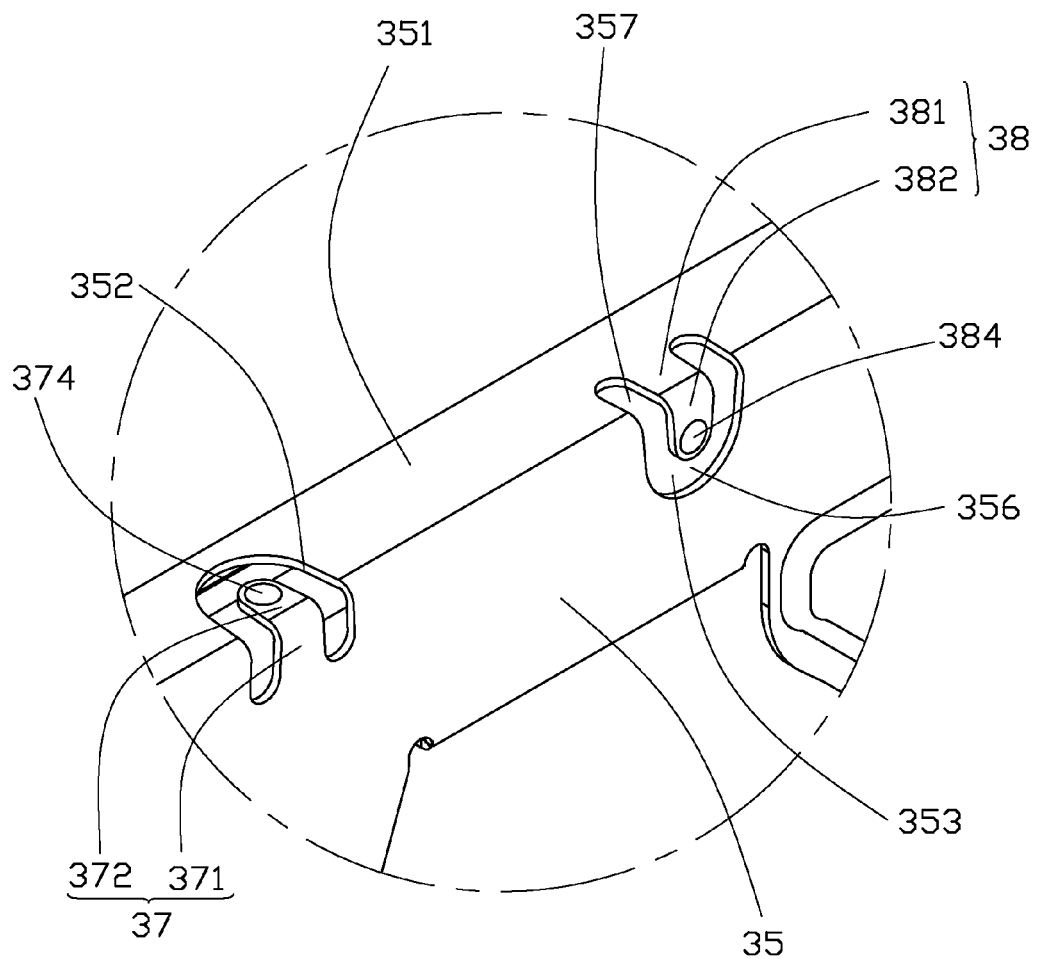
FIG. 2 is an enlarged view of the part II of FIG. 1.

Referring to FIGS. 1 and 2, the top edge of the rear plate 35 is bent substantially perpendicularly to form a support piece 351. The support piece 351 is capable of supporting the cover 36. A plurality of first cutouts 352 and second cutouts 353 are defined at a conjunction portion of the rear plate 35 and the support piece 351. Each first cutout 352 and each second cutout 353 includes a first portion 356 defined in the rear plate 35, and a second portion 357 defined in the support piece 351. Each first cutout 352 has a substantially "L"-shaped first elastic piece 37 formed therein, and each second cutout 353 has a second elastic piece 38 formed therein. The first elastic piece 37 includes a vertical first connection portion 371 and a horizontal first contact portion 372. The first connection portion 371 is connected to the rear plate 35 and located in the first portion 356 of corresponding first cutout 352. The first contact portion 372 is located in the second portion 357 of corresponding first cutout 352. The first contact portion 372 is not connected to the support piece 351. The first contact portion 372 and the support piece 351 are located in a same horizontal plane. A first contact point 374 protrudes from the first contact portion 372.

The second elastic piece 38 includes a substantially horizontal second connection portion 381 and a substantially vertical second contact portion 382. The second connection portion 381 is connected to the support plate 351 and is located in the second portion 357 of corresponding second cutout 353. The second contact portion 382 is located in the first portion 356 of the corresponding second cutout 353, and it is not connected to the rear plate 35. The second contact portion 382 and the rear plate 35 are located in a same vertical plane. A second contact point 384 protrudes from the second contact portion 382.

Figure 3:
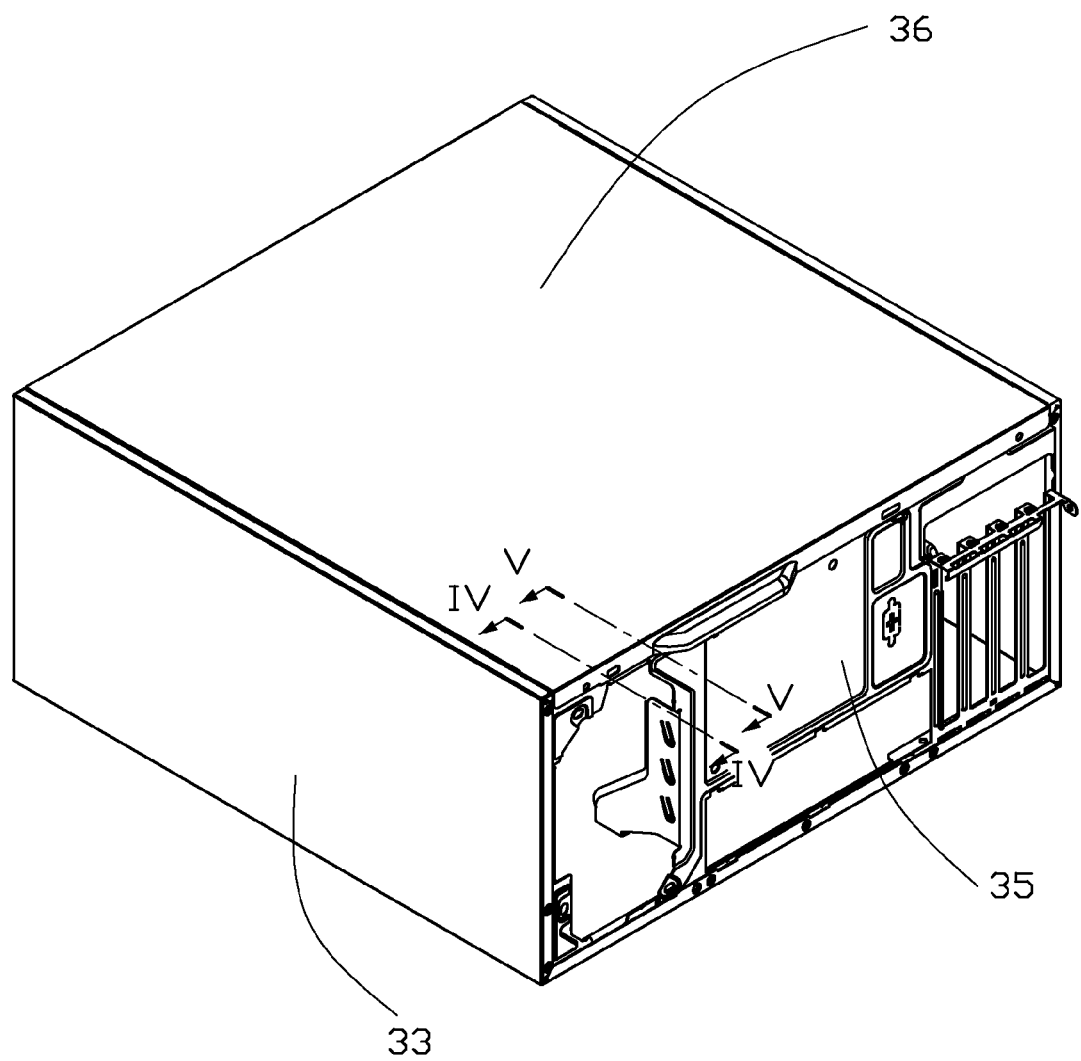
FIG. 3 is an assembly view of the enclosure of FIG. 1.
Figure 4:
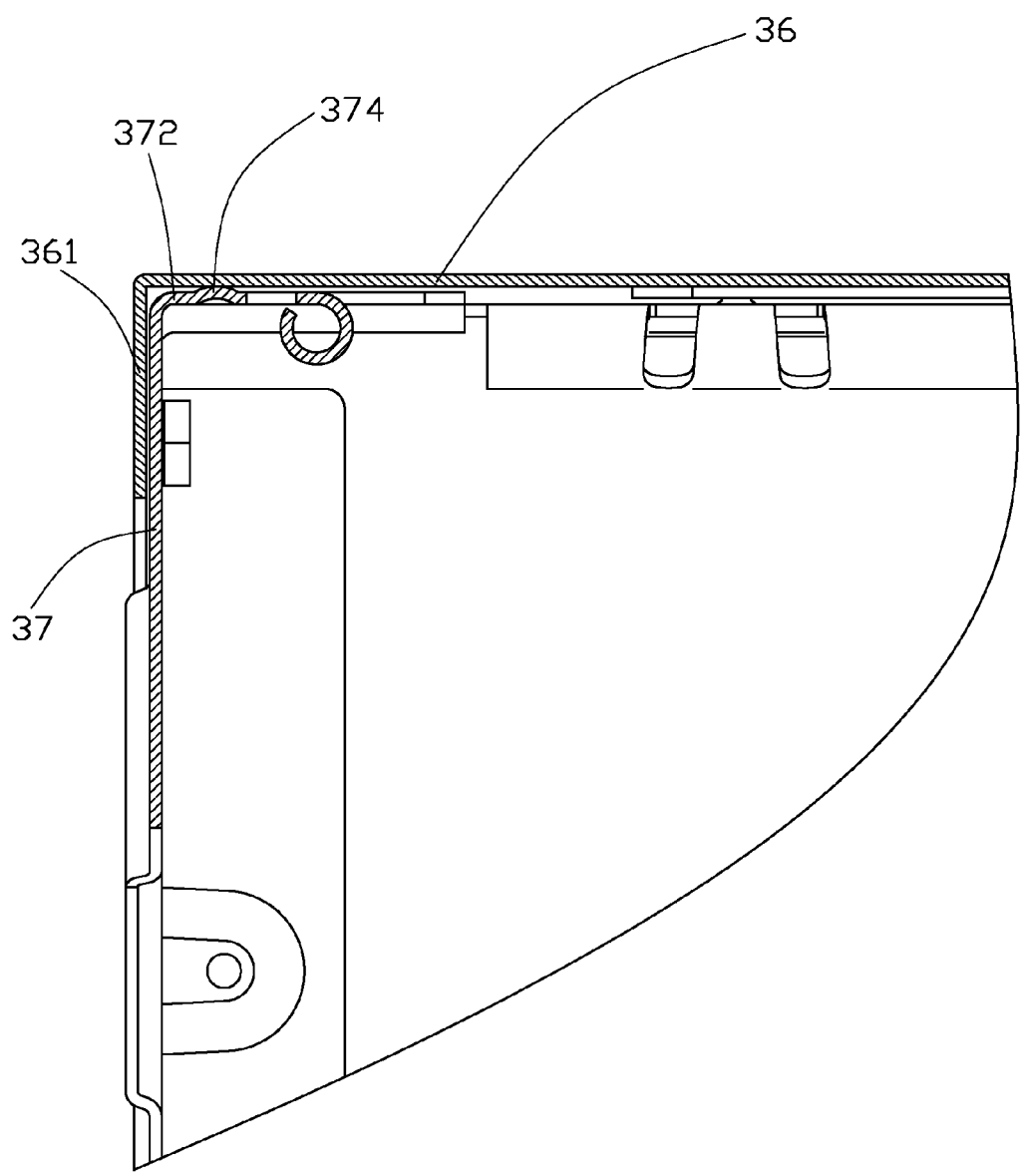
FIG. 4 is a sectional view along line IV-IV of FIG. 3.
Figure 5:
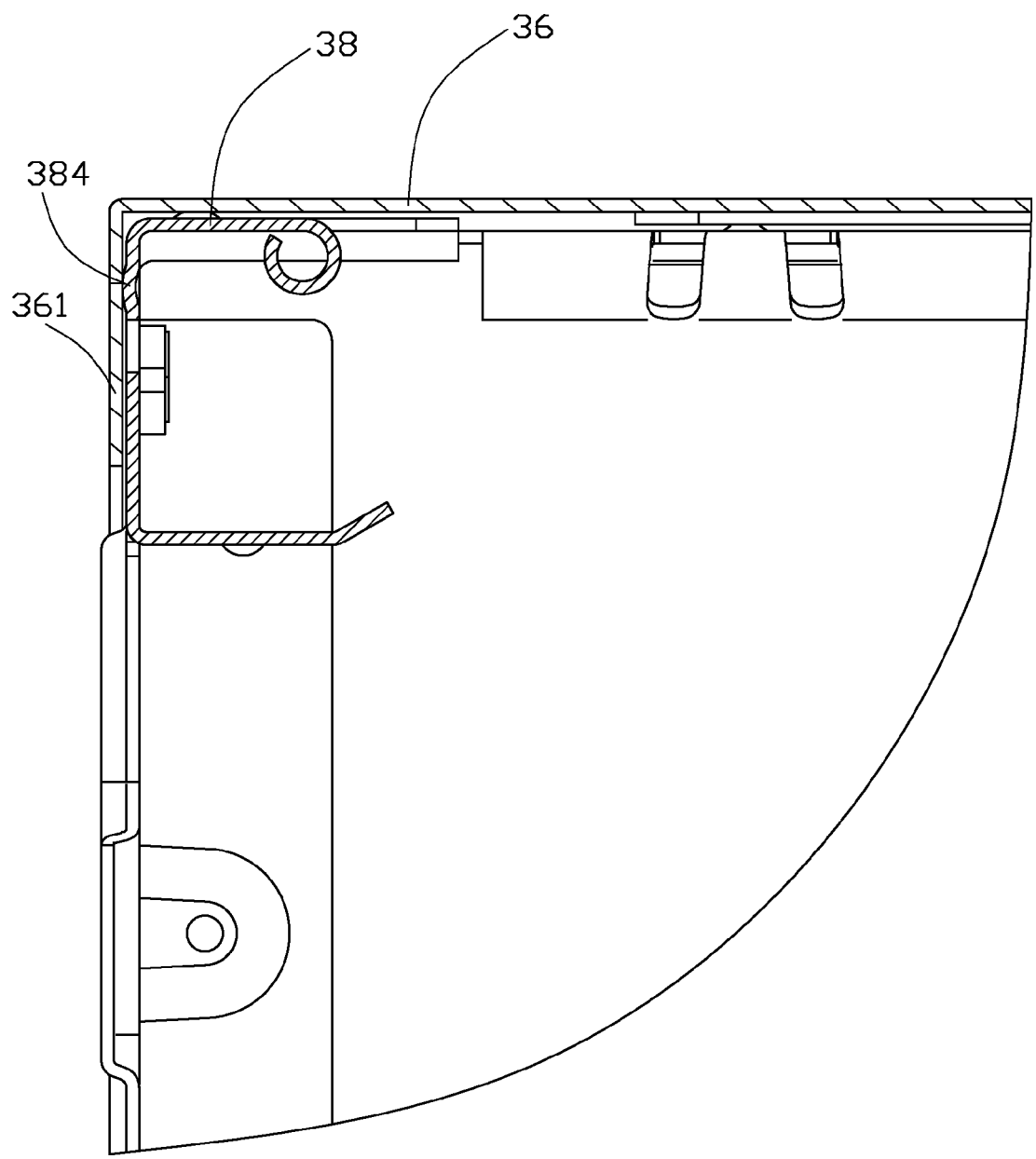
FIG. 5 is a sectional view along line V-V of FIG. 3.

Referring to FIGS. 3 to 5, to assemble the cover 36 on the enclosure 30, the cover 36 is located on the support piece 351 of the rear plate 35, and the top edges of the front plate 34 and the side plates 33. The first contact point 374 of the first elastic piece 37 contacts with the cover 36 in a first direction, which is substantially perpendicular with the cover 36. The cover 36 presses and distorts the first contact portion 372 of the first elastic piece 37. The cover 36 moves so the distorted piece 361 resists against the rear plate 35. The second contact point 384 of the second elastic piece 38 contacts with the distorted piece 361 of the cover 36 in a second direction, which is substantially parallel with the cover 36. The distorted piece 361 presses and distorts the second contact portion 382 of the second elastic piece 38. At last, the cover 36 is secured on the enclosure 30 with screws, latches or other conventional manners.

In the above embodiment, both of the first and second elastic pieces 37 and 38 are substantially "L"-shaped. The substantially "L" shape elastic pieces 37 and 38 have greater yield strength then strip shape elastic pieces. Therefore, the substantially "L" shape elastic pieces 37 and 38 can keep good elasticity after long time use. In addition, the first and second elastic pieces 37 and 38 contact with the cover 36 in different directions to achieve EMI shielding.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An enclosure of an electronic device, comprising:
a rear plate, a support piece located on a top edge of the rear plate, a first and a second cutouts defined at a conjunction portion of the rear plate and the support piece; each of the first and second cutouts comprising a first portion defined in the rear plate and a second portion defined in the support piece; a first elastic piece located in the first cutout, wherein the first elastic piece is connected to the rear plate and extends into the second portion of the first cutout the first elastic piece comprises a first connection portion connected to the rear plate and a first contact portion located in the second portion of the first cutout; and a second elastic piece located in the second cutout, wherein the second elastic piece is connected to the support piece and extends into the first portion of the second cutout, the second elastic piece comprises a second connection portion connected to the support piece and a second contact portion located in the first portion of the second cutout; and a cover, and a distorted piece located on a rear edge of the cover; wherein the cover biases the first contact portion towards the support piece in a first direction which is perpendicular to the cover; and the distorted piece abuts the rear plate to urge the second contact portion towards the rear plate in a second direction which is parallel with the cover.

2. The enclosure of claim 1, wherein a first contact point protrudes from the first contact portion, and the first contact point abuts the cover.

3. The enclosure of claim 2, wherein the first contact portion is not connected to the support piece and is bent by the cover.

4. The enclosure of claim 1, wherein a second contact point protrudes from the second contact portion, and the second contact point abuts the distorted piece.

5. The enclosure of claim 4, wherein the second contact portion is not connected to the rear plate and is bent by the distorted piece.

6. The enclosure of claim 1, wherein the rear plate is perpendicular to the support piece, and the first and second elastic pieces are "L"-shaped.

7. An enclosure of an electronic device, comprising:

a bottom plate, edges of the bottom plate connected to a front plate, a rear plate and two side plates, each of the front plate, the rear plate and the two side plates having a top edge, and the top edges of the front plate, the rear plate, and the two side plates together defining an opening; a support piece perpendicularly connected to the top edge of the rear plate, a first elastic piece connected to the rear plate, the first elastic piece comprising a first contact portion located in a plane of the support piece; and a second elastic piece connected to the support piece, and the second elastic piece comprising a second contact portion located in a plane of the rear plate; and wherein a first and a second cutout are defined at a conjunction portion of the rear plate and the support piece, each of the first and second cutouts includes a first portion defined in the rear plate and a second portion defined in the support piece; the first elastic piece is formed in the first cutout, the first elastic piece is connected to the rear plate, and the first contact portion is located in the second portion of the first cutout; and the second elastic piece is located in the second cutout, the second elastic piece is connected to the support piece, and the second contact portion is located in the first portion of the second cutout; and a cover, and a distorted piece perpendicularly connected to a rear edge of the cover; the cover located on the support piece and shielding the opening, wherein the cover contacts the first contact portion to bias the first contact portion towards the support piece, and the distorted piece contacts the second contact portion to bias the second contact portion towards the rear plate.

8. The enclosure of claim 7, wherein a first contact point protrudes from the first contact portion, and the first contact point abuts the cover.

9. The enclosure of claim 8, wherein the first contact portion is not connected to the support piece and is bent by the cover.

10. The enclosure of claim 7, wherein a second contact point protrudes from the second contact portion, and the second contact point abuts the distorted piece.

11. The enclosure of claim 10, wherein the second contact portion is not connected to the rear plate and is bent by the distorted piece.

12. The enclosure of claim 7, wherein the first and second elastic pieces are "L"-shaped.

* * * * *